United States Patent
Ataie et al.

(10) Patent No.: US 9,106,325 B2
(45) Date of Patent: Aug. 11, 2015

(54) METHOD FOR WIDEBAND SPECTRALLY EQUALIZED FREQUENCY COMB GENERATION

(71) Applicants: Vahid Ataie, San Diego, CA (US); Stojan Radic, San Diego, CA (US)

(72) Inventors: Vahid Ataie, San Diego, CA (US); Stojan Radic, San Diego, CA (US)

(73) Assignee: NICOLA ALIC, La Jolla (*) Notice: Subject to any disclaimer, the term of this patent is extended or adjusted under 35 U.S.C. 154(b) by 0 days.

(21) Appl. No.: 14/205,089

(22) Filed: Mar. 11, 2014

(65) Prior Publication Data

US 2014/0254619 A1    Sep. 11, 2014

Related U.S. Application Data

(60) Provisional application No. 61/776,519, filed on Mar. 11, 2013.

(51) Int. Cl.
| | |
|---|---|
| *G02F 1/35* | (2006.01) |
| *H01S 3/10* | (2006.01) |
| *H04B 10/00* | (2013.01) |
| *H01S 5/00* | (2006.01) |

(52) U.S. Cl.
CPC .............. *H04B 10/00* (2013.01); *H01S 5/0057* (2013.01); *H01S 5/0085* (2013.01); *H01S 5/0092* (2013.01)

(58) Field of Classification Search
None
See application file for complete search history.

(56) References Cited

U.S. PATENT DOCUMENTS

| | | | |
|---|---|---|---|
| 7,239,442 B2 | 7/2007 | Kourogi et al. | |
| 7,551,342 B2 | 6/2009 | Kourogi et al. | |
| 7,712,977 B2 | 5/2010 | Kourogi et al. | |
| 7,769,298 B2* | 8/2010 | Igarashi et al. | 398/146 |
| 7,881,620 B2 | 2/2011 | Nicholson et al. | |
| 8,023,775 B2 | 9/2011 | Sakamoto et al. | |
| 8,120,841 B2 | 2/2012 | Sosabowski et al. | |
| 8,447,155 B1* | 5/2013 | Kuo et al. | 385/122 |
| 8,571,075 B2 | 10/2013 | Fermann et al. | |
| 8,571,419 B2 | 10/2013 | Bouda | |
| 2010/0284431 A1* | 11/2010 | Inoue | 372/32 |
| 2012/0087004 A1 | 4/2012 | Kwon et al. | |
| 2015/0029575 A1* | 1/2015 | Hara et al. | 359/279 |

* cited by examiner

*Primary Examiner* — Hemang Sanghavi
(74) *Attorney, Agent, or Firm* — Ditthavong & Steiner, P.C.

(57) ABSTRACT

The present invention relates to method for spectrally equalized frequency comb generation. In order to carry this method, the following steps are followed: seed laser or lasers are modulated to acquire frequency chirp necessary to enable temporal compression and an increase in peak optical intensity necessary for an efficient nonlinear optical mixing process to occur; the compressed waveform is reshaped by non-linear-transfer optical element and subsequently used to generate frequency comb in nonlinear waveguide. Ultimately, at the conclusion of these steps, a frequency comb is generated with substantially flat optical spectrum, while retaining variability with respect to the frequency pitch, high coherency and substantially wide spectral band of coverage.

17 Claims, 6 Drawing Sheets

METHOD FOR WIDEBAND SPECTRALLY EQUALIZED FREQUENCY COMB GENERATION

CROSS-REFERENCE TO RELATED APPLICATION

This application claims the benefit of U.S. Provisional Patent Application Ser. No. 61/776,519 by Vahid Ataie and Stojan Radic, entitled "A Method for Wideband Spectrally Equalized Frequency Comb Generation" and filed on Mar. 11, 2013, the contents of which are incorporated herein in their entirety by this reference.

FIELD OF THE INVENTION

The present invention relates generally to frequency generation and more particularly to spectrally equalized frequency comb generation over a wide spectral area. The method is of particular interest for communication and sensing systems requiring multiple, spectrally equalized frequency tones positioned over a substantial spectral band.

BACKGROUND OF THE INVENTION

Frequency comb generation is motivated by applications in sensing, spectroscopy, RF synthesis, clock distribution and general communications. A frequency comb generally represents multiple (more than two) distinct frequency tones and can include hundreds or thousands of frequencies spread over predefined spectral range. Conventional frequency comb generation is accomplished by using the combination of stabilized optical lasers and nonlinear optical process. These solutions are generally constrained with respect to the variability of frequency spacing between generated tones, width of the spectral band covered by such frequency comb, spectral equalization among generated frequency tones and spectral tone purity. Conventional frequency comb generation generally fails because it relies on techniques that cannot address either the bandwidth, variable frequency pitch, spectral purity, spectral equalization or a combination of these factors.

A frequency comb generator should produce multiple frequency tones over wide spectral range, and in spectrally equalized manner. The spectral equalization is of critical importance in sensing, metrology and communication applications that require the power of frequency tones comprising the comb to be maintained at substantially constant level. When the frequency comb is used for providing multiple carriers (channels) at the transmitter node of the communication, each tone power should be maintained at the same level in order to preserve the same transmission reach for all channels. When the frequency comb is used to provide multiple local oscillators at the end receiver node of the transmission link, the performance of each channel requires that frequency tones possess equal power. The most common realization of frequency comb fails to achieve spectral equalization, and particularly so when the bandwidth of the spectral comb exceeds narrow range of approximately 10 nanometers. Of equal importance, the common realization cannot maintain spectral flatness, variability of frequency comb pitch, comb coherency and bandwidth simultaneously. In most common realizations, these parameters are traded in detrimental manner: spectral flatness is commonly achieved only over narrow spectral band range; high coherency is achieved at the expense of fixed, non-selectable frequency pitch; high coherency is achieved at the expense of using high power, frequency fixed laser seeds.

It would be desirable to generate a frequency comb in a manner that its frequency pitch, defined as spacing between the closest frequency tones, can be varied independently from the stabilized laser source used for its generation. Furthermore, it would be useful that frequency comb can be generated over wide spectral area and particularly over the area exceeding the capabilities of conventional radio-frequency generation means. Still further, it would be also desirable that the generated comb has spectral equalization, defined as difference in power among frequency tones comprising the frequency comb, i.e. frequency tones are generated with substantially equal power. Furthermore, it would be useful if spectral purity, also defined as a coherency, of generated frequency tones remains high. Therefore, there is a current need in the field for new means for generation of variable frequency pitch combs that are spectrally equalized over substantially wide spectral band, while retaining high degree of coherency.

SUMMARY OF THE INVENTION

The present invention advantageously fills the aforementioned deficiencies by enabling generation of spectrally equalized frequency combs over wide spectral range which provides for operation of general sensing, metrology and communication devices.

The present invention is a method for frequency comb generator design that allows synthesis of spectrally flat response over wide spectral band and which consists of the following core components: seeding optical source, phase-chirping section, waveform compression section, nonlinear transfer regeneration section and mixer section. The sequence of these functions enables practical means for efficient, spectrally equalized and wideband generation of multiple new tones comprising the frequency comb using a low power seed laser device.

The present invention may also have one or more of the following features:

In one embodiment, a single laser is used to seed the generation of wideband, spectrally flat (equalized) comb. Alternatively, when frequency pitch, or separation between two adjacent comb tones has to be large, two laser sources can be used to seed frequency generation that generates spectrally flat comb. In yet another embodiment, the frequency flat comb generation is accomplished by the use of nonlinear transfer optical element such as, but not limited to, nonlinear optical loop mirror in order to reshape the compressed waveform necessary for efficient frequency generation. In further embodiment, core elements identified as waveform compressor, nonlinear regenerator and mixer can be repeated in order to achieve increased frequency generation efficiency, spectral flatness, bandwidth or the combination of these. In yet another embodiment, intra-device amplification can be used to increase the coherency of the frequency comb while simultaneously retaining the desirable characteristics such as spectral flatness and bandwidth. Furthermore, another embodiment allows for generation of spectrally flat wideband frequency comb that can possess variable frequency pitch. Yet another embodiment includes injection-locked lasers as seeds to guarantee simultaneous spectral flatness, high coherency and wide spectral bandwidth.

The present invention method is unique when compared with other known processes and solutions in that it: (1) can generate spectrally equalized frequency combs over substantially larger spectral bandwidth; (2) can achieve wideband spectral flatness while allowing for variable frequency pitch; (3) can achieve wideband spectral flatness while maintaining high degree of spectral purity (coherency) and (4) it allows for significant reduction in power dissipation and physical size.

The present invention is unique in that it is different from other known processes or solutions. More specifically, the present invention owes its uniqueness to the fact that it: (1) allows the use of low-power laser seed; (2) enables low-dissipation frequency comb operation and (3) enables for frequency- and temporal control of frequency comb generation.

Among other things, it is an objective of the present invention to provide generation of spectrally equalized frequency combs over wide spectral range that does not suffer from any of the problems or deficiencies associated with prior solutions.

It is still further an object of the present invention to simplify construction of spectrally equalized frequency combs.

Further still, it is an object of the present invention to reduce power consumption and complexity associated with frequency comb generator.

BRIEF DESCRIPTION OF THE DRAWINGS

The present invention now will be described more fully hereinafter with reference to the accompanying drawings, which are intended to be read in conjunction with both this summary, the detailed description and any preferred and/or particular embodiments specifically discussed or otherwise disclosed. This invention may, however, be embodied in many different forms and should not be construed as limited to the embodiments as set forth herein; rather, these embodiments are provided by way of illustration only and so that this disclosure will be thorough, complete and will fully convey the full scope of the invention to those skilled in the art.

DETAILED DESCRIPTION OF THE INVENTION

Figure 1:
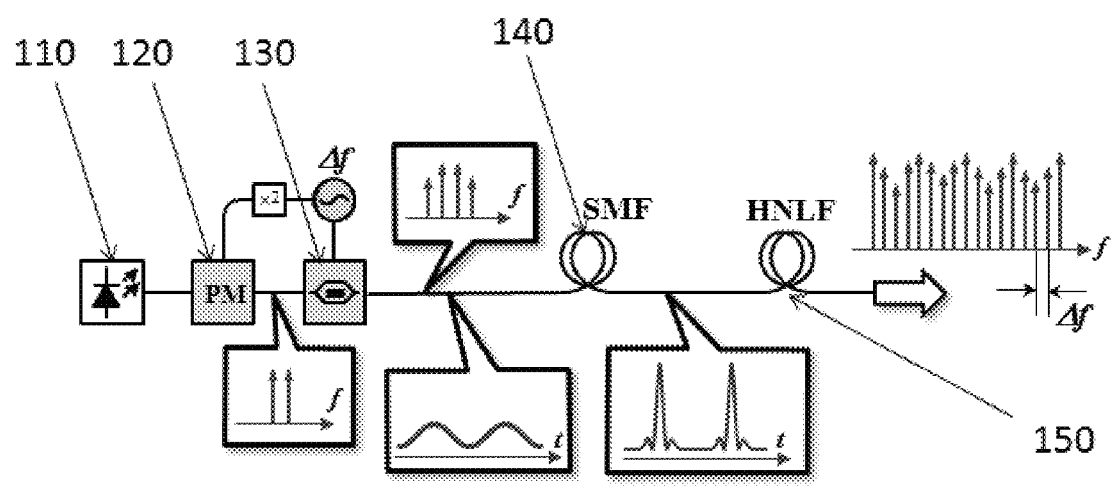
FIG. 1 shows a frequency comb generator comprising of chirping, compression and mixing stage.

The present invention is directed at generation of spectrally equalized frequency combs over a wide spectral range.

In the preferred embodiment of the invention, a seed waveform is chirped in order to enable its temporal compression and peak intensity increase. The seed waveform is created by modulating a single laser output in case when frequency comb pitch does not exceed the bandwidth of the optical modulator. In a case when frequency comb pitch exceeds the bandwidth of modulator device, the seed waveform is created by beating between two lasers that can be either free running or injection locked to the master to achieve phase correlation. The seed waveform is subsequently chirped. The chirp can be induced by nonlinear self-phase modulation in nonlinear waveguide. Alternatively, the chirping can be accomplished by using an optical modulator device. Subsequently, the chirped seed waveform is compressed in dispersive waveguide in order to increase the intensity peak of the original waveform and increase the efficiency of the mixing process. The compression step necessarily produces the waveform that is composed of intensity peak and trailing and leading sidelobes with substantially lower intensities. The existence of satellite peaks represents departure from the ideal, single-peak pulse seed shape and represent unwanted distortion. This distortion leads to interference during the subsequent mixing step that results in generation of new tones comprising the frequency comb. The distortion induced interference during the frequency generation process leads to spectrally non-equalized frequency comb spectra, manifesting itself in varied powers of tones comprising the frequency comb. Instead of using distorted waveform to seed the mixing stage, it is necessary to reshape the waveform and remove the distortion leading to interference induction during the mixing process. To achieve this, the embodiment of the invention requires the use of nonlinear optical transfer element that can discriminate waveform with respect to optical intensity. Such element precedes the mixing stage and is subsequent to compression stage of the frequency comb generator. In one embodiment of the invention, the nonlinear transfer element suppresses trailing (leading) sidelobes of the compressed waveform, allowing the single-peak waveform to seed the mixer stage and produce spectrally equalized frequency comb. In another embodiment, the nonlinear transfer element is realized by using nonlinear optical loop mirror. In yet another embodiment, the optical loop mirror provides simultaneous intensity discrimination, i.e. regeneration and additional waveform chirping function. The stated succession of seed waveform generation, compression, regeneration and frequency mixing represents the preferred realization of the frequency generation. In yet another embodiment, the spectral flatness, coherency, power and bandwidth of the frequency comb generator can be controlled and increased by adding more than one regeneration and compression stage.

Referring to the figures, FIG. 1 shows the frequency comb generator that uses a single continuous frequency (CW) laser (110) to generate multiple frequency tones. The laser is modulated using phase modulator (120) and amplitude modulator (130) to create the initial seed waveform that is chirped and ready for compression. The waveform compression occurs in a dispersive element, illustrated in form of single-mode fiber (140). The frequency and temporal representation of the seed waveform is indicated in figure insets. After compression (140), the peak of the waveform is substantially increased, as indicated in inset immediately after SMF. Finally, the high-peak (compressed) waveform seeds highly nonlinear fiber (HNLF) (150) resulting in an efficient and wideband mixing process that directly leads to frequency comb generation. The sequence indicated in FIG. 1, while capable of generating wideband, coherent and variable-pitch frequency comb also results in spectrally unequal (spectrally rippled) output due to distortion of the compressed waveform prior to the mixer stage (HNLF). In FIG. 1, this distortion is illustrated in form of trailing/leading pulse sidelobes.

Figure 2:
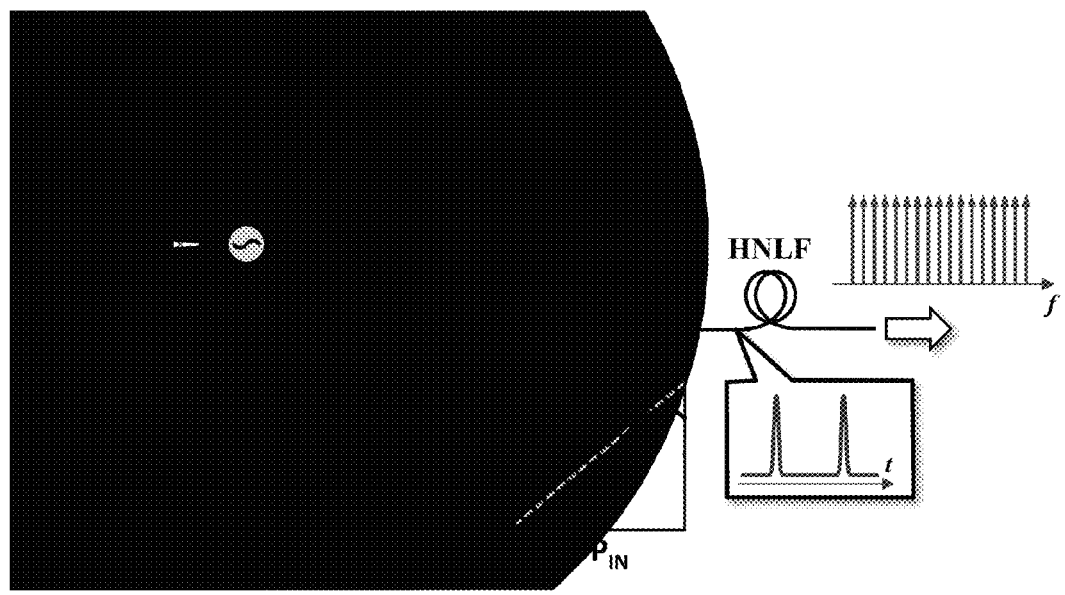
FIG. 2 shows a frequency comb generator comprising of chirping, compression, regeneration and mixing stage.
Figure 3:
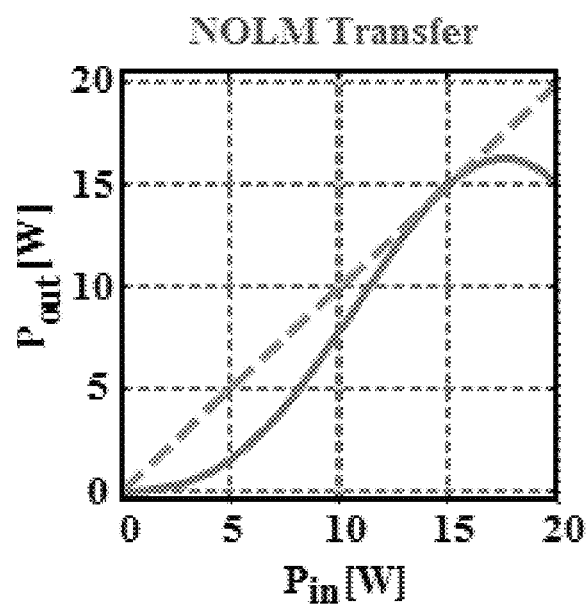
FIG. 3 shows regeneration stage transfer characteristics.

To remedy the output spectral ripple, a nonlinear transfer element is introduced, as illustrated in FIG. 2. A nonlinear optical loop mirror (NOLM) (160) is used to suppress the compressed pulse distortion and generate mixer seeding pulses that are comprised of substantially single-peak pulses, as illustrated in inset after NOLM element. Consequently, spectrally equalized frequency comb output is achieved. FIG. 3 illustrates transfer characteristics of the NOLM element.

Figure 4:
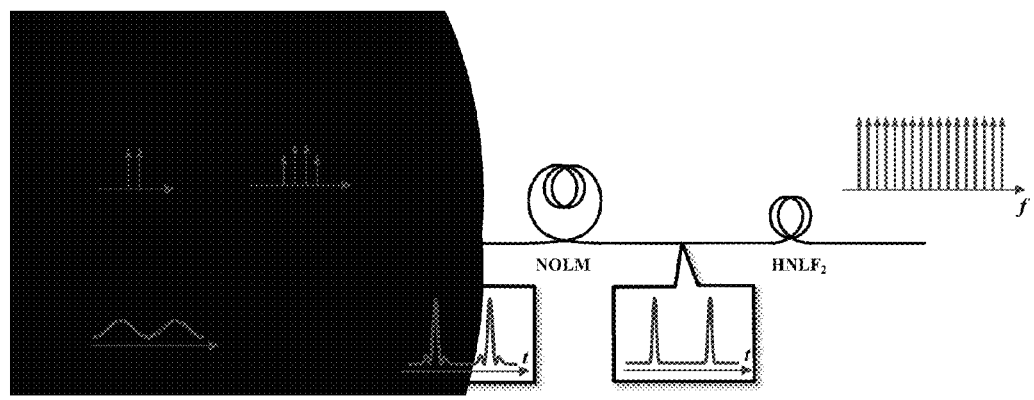
FIG. 4 shows a realization of an equivalent chirping section when the frequency pitch of the comb exceeds the modulator bandwidth, in which the modulator section is replaced by beating between two laser sources and a nonlinear fiber section that induces chirping via self-phase modulation in a HNLF section.
Figure 5:
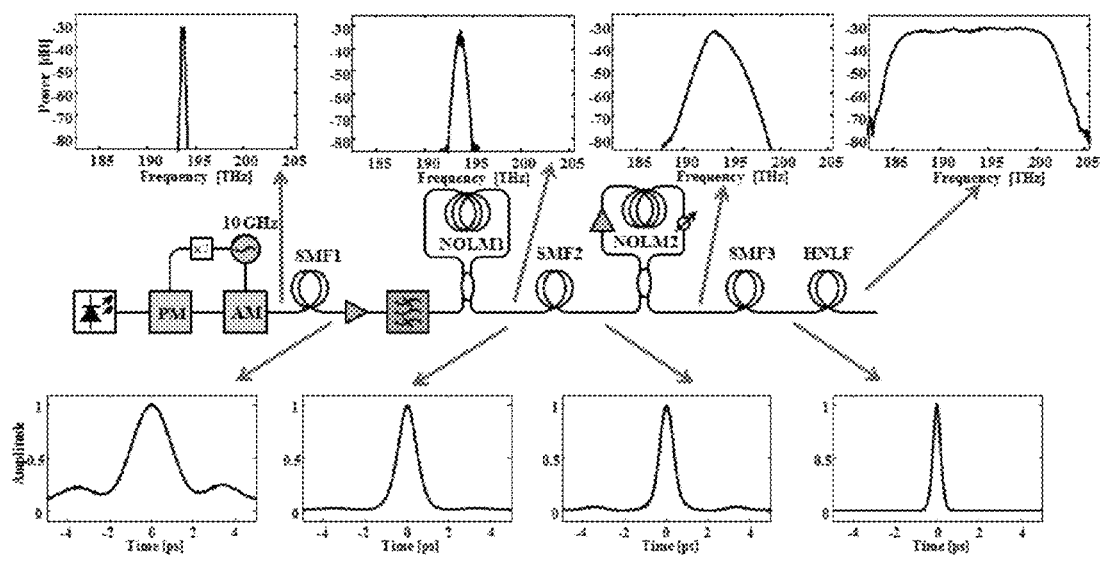
FIG. 5 shows an example of frequency comb generator comprising of chirping, and multiple compression, regeneration stages and a single mixing stage.

In case when frequency pitch of the comb exceeds the modulator bandwidth, the equivalent chirping section can be realized as shown in FIG. 4. FIG. 5 illustrates frequency generator using concatenated compression and regeneration sections (SMF1-NOLM1 and SMF2-NOLM2) in order to further improve the frequency comb performance. Insets illustrate measured generator temporal and spectral evolution. A modulator section is replaced by beating between two laser sources and nonlinear fiber section that induces chirping via self-phase modulation in HNLF section (170). Consequently, the compression, pulse reshaping (regeneration) and mixing process proceeds similar to that in FIG. 2.

Figure 6:
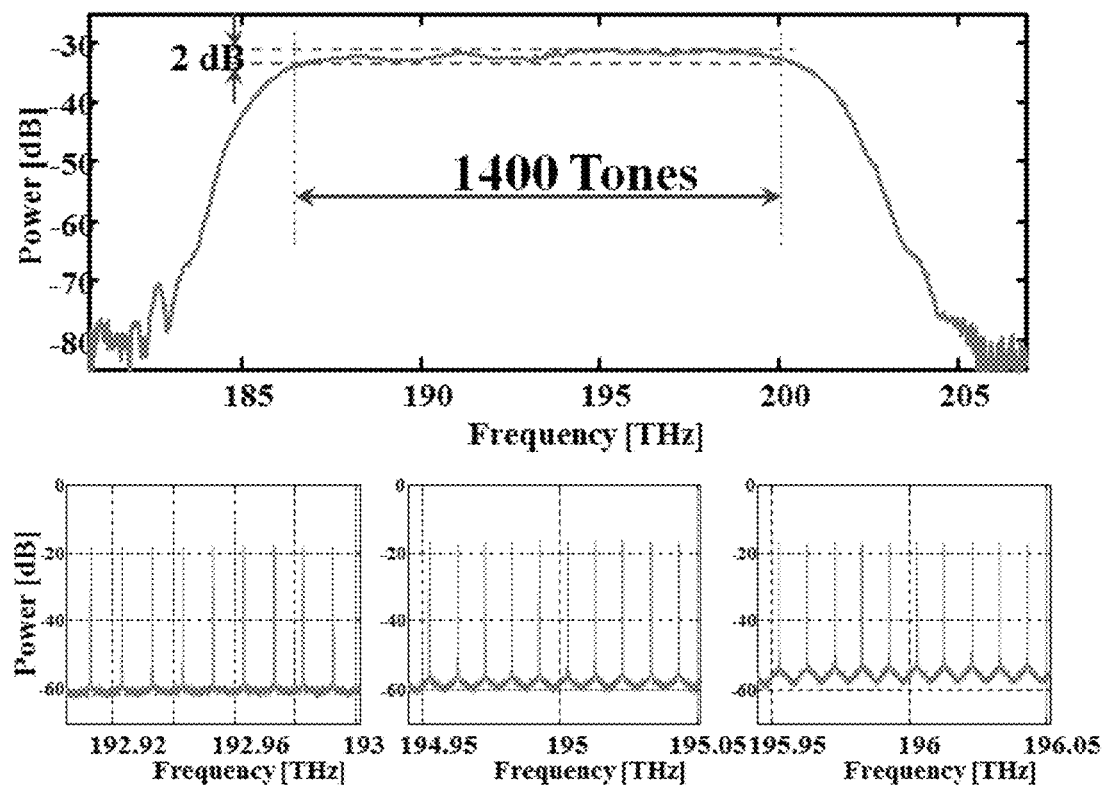
FIG. 6 shows the measured performance of the frequency comb generator shown in FIG. 4.

FIG. 6 illustrates the measured performance of a frequency comb generator as shown in FIG. 5.

ADVANTAGES OF THE INVENTION

The present invention provides an improved method for wideband frequency comb generation. In particular, the present invention provides a method for spectrally equalized frequency comb generation over a wide spectral area. The method of the present invention provides maintenance of spectral flatness, variability of frequency comb pitch, comb coherency, and bandwidth simultaneously while also maintaining spectral purity and requiring relatively low power usage. Methods of the present invention are particularly useful for operation of general sensing, metrology, and communications devices.

The present invention possesses industrial applicability as a method for provide wideband frequency comb generation.

The method claims of the present invention provide specific method steps that are more than general applications of laws of nature and require that those practicing the method steps employ steps other than those conventionally known in the art, in addition to the specific applications of laws of nature recited or implied in the claims, and thus confine the scope of the claims to the specific applications recited therein. The method steps require the use of specific hardware and involve specific processes involving the hardware that generate a change in physical state of the hardware.

The inventions illustratively described herein can suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the future shown and described or any portion thereof, and it is recognized that various modifications are possible within the scope of the invention claimed. Thus, it should be understood that although the present invention has been specifically disclosed by preferred embodiments and optional features, modification and variation of the inventions herein disclosed can be resorted by those skilled in the art, and that such modifications and variations are considered to be within the scope of the inventions disclosed herein. The inventions have been described broadly and generically herein. Each of the narrower species and subgeneric groupings falling within the scope of the generic disclosure also form part of these inventions. This includes the generic description of each invention with a proviso or negative limitation removing any subject matter from the genus, regardless of whether or not the excised materials specifically resided therein.

It is also to be understood that the above description is intended to be illustrative and not restrictive. Many embodiments will be apparent to those of in the art upon reviewing the above description. The scope of the invention should therefore, be determined not with reference to the above description, but should instead be determined with reference to the appended claims, along with the full scope of equivalents to which such claims are entitled. The disclosures of all articles and references, including patent publications, are incorporated herein by reference.

What is claimed is:

1. A method for wideband frequency comb generation comprising:
   (a) creating a seed waveform by modulating a single laser output;
   (b) chirping the seed waveform created in step (a) to enable its temporal compression and peak intensity increase;
   (c) compressing the chirped seed waveform in a dispersive waveguide in order to increase the intensity peak of the waveform and increase efficiency of mixing;
   (d) employing a nonlinear optical transfer element that can discriminate the waveforms with respect to optical intensity; and
   (e) mixing the waveforms to generate the frequency comb.

2. The method of claim 1 wherein frequency comb pitch does not exceed the bandwidth of an optical modulator.

3. The method of claim 1 wherein the waveform is chirped by nonlinear self-phase modulation in a nonlinear waveguide.

4. The method of claim 1 wherein the waveform is chirped by use of an optical modulator device.

5. The method of claim 1 wherein the nonlinear transfer element suppresses trailing (leading) sidelobes of the compressed waveform, allowing the single-peak waveform to seed the mixer stage and produce a spectrally equalized frequency comb.

6. The method of claim 1 wherein the nonlinear transfer element employs an optical loop mirror.

7. The method of claim 6 wherein the optical loop mirror provides simultaneous intensity discrimination, i.e., regeneration, and an additional waveform chirping function.

8. The method of claim 1 wherein more than one regeneration and compression stage is employed to control and increase the spectral flatness, coherency, power and bandwidth of the frequency comb generator.

9. The method of claim 1 wherein the laser is modulated using a phase modulator and an amplitude modulator to create the initial seed waveform.

10. The method of claim 1 wherein the frequency generator uses concatenated compression and regeneration sections to improve frequency comb performance.

11. The method of claim 1 wherein the method employs a frequency comb generator comprising chirping, compression, and mixing stages.

12. The method of claim 1 wherein the method employs a frequency comb generator comprising chirping, compression, regeneration, and mixing stages.

13. The method of claim 1 further employing intra-device amplification.

14. A method for wideband frequency comb generation comprising:
   (a) creating a seed waveform by beating between two lasers;
   (b) chirping the seed waveform created in step (a) to enable its temporal compression and peak intensity increase;
   (c) compressing the chirped seed waveform in a dispersive waveguide in order to increase the intensity peak of the waveform and increase efficiency of mixing;
   (d) employing a nonlinear optical transfer element that can discriminate the waveforms with respect to optical intensity; and
   (e) mixing the waveforms to generate the frequency comb.

15. The method of claim 14 wherein the frequency comb pitch exceeds the bandwidth of a modulator device.

16. The method of claim 14 where the two lasers are free running.

17. The method of claim 14 wherein the two lasers are injection locked to a master to achieve phase correlation.

\* \* \* \* \*